United States Patent
An et al.

(10) Patent No.: US 7,538,566 B2
(45) Date of Patent: May 26, 2009

(54) ELECTRICAL TEST SYSTEM INCLUDING COAXIAL CABLES

(75) Inventors: Young-Soo An, Yongin-si (KR); Se-Jang Oh, Seongnam-si (KR); Jung-Hyun Nam, Seoul (KR)

(73) Assignee: Samsung Electronics Co., Ltd., Suwon-si, Gyeonnggi-do (KR)

( * ) Notice: Subject to any disclaimer, the term of this patent is extended or adjusted under 35 U.S.C. 154(b) by 0 days.

(21) Appl. No.: 11/926,172

(22) Filed: Oct. 29, 2007

(65) Prior Publication Data

US 2008/0100314 A1    May 1, 2008

(30) Foreign Application Priority Data

Oct. 31, 2006    (KR) .................. 10-2006-0106718

(51) Int. Cl.
*G01R 31/02* (2006.01)
*G01R 31/28* (2006.01)

(52) U.S. Cl. .................. 324/754; 324/761; 324/765
(58) Field of Classification Search .......... 324/754–765
See application file for complete search history.

(56) References Cited

U.S. PATENT DOCUMENTS

| | | | |
|---|---|---|---|
| 6,348,810 B1 * | 2/2002 | Yanagawa et al. | ........... 324/765 |
| 7,077,675 B2 | 7/2006 | Maeda et al. | |
| 2002/0027444 A1 * | 3/2002 | Jones et al. | .................. 324/754 |
| 2006/0255821 A1 * | 11/2006 | Goto | .......................... 324/760 |
| 2007/0096756 A1 * | 5/2007 | Parrish et al. | ................ 324/754 |

FOREIGN PATENT DOCUMENTS

| | | | |
|---|---|---|---|
| JP | 2000-088920 | | 3/2000 |
| JP | 2005283569 | * | 10/2005 |
| KR | 20-0319210 | | 7/2003 |
| KR | 100589759 B1 | | 6/2006 |

* cited by examiner

*Primary Examiner*—Ha Tran T Nguyen
*Assistant Examiner*—Emily Y Chan
(74) *Attorney, Agent, or Firm*—Volentine & Whitt, PLLC

(57) ABSTRACT

An electrical test system includes a test head, a performance board, a probe card and coaxial cables. The performance board includes a first side and an opposite second side, where the first side of the performance board is electrically connected to the test head and the second side of the performance board includes first coaxial cable connection portions. The probe card includes a first side and an opposite second side, where the first side of the probe card includes second coaxial cable connection portions and the second side includes a wafer test probes. The coaxial cables respectively electrically connect the first coaxial cable connection portions of the performance board to the second coaxial cable connection portions of the probe card.

13 Claims, 3 Drawing Sheets

ELECTRICAL TEST SYSTEM INCLUDING COAXIAL CABLES

CROSS-REFERENCE TO RELATED APPLICATION(S)

A claim of priority is made to Korean Patent Application No. 10-2006-0106718, filed Oct. 31, 2006, in the Korean Intellectual Property Office, the disclosure of which is incorporated herein in its entirety by reference.

BACKGROUND OF THE INVENTION

1. Field of the Invention

The present invention generally relates to a system for testing, and more particularly, to an electrical test system for testing a wafer.

2. Description of the Related Art

The high-speed parallel testing of a wafer-level semiconductor chip is presently limited to about 500 MHz. This is primarily caused by inherent limitations in probe cards utilized in parallel testing. Probe cards are known to achieve super-GHz high-speed testing, but these probe cards are used for serial (not parallel) testing. In other words, these probe cards are not adapted be applied to a wafer parallel test in which an electrical test is simultaneously performed on a plurality of semiconductor chips.

Electrical connection of a probe card with a performance board attached to a test head of a tester is generally made using a zero input force (ZIF) connector. The ZIF connector, however, can constitute a substantial source of signal loss.

FIG. 1 is a block diagram of a conventional electrical test system for a high-speed wafer parallel test, and FIG. 2 is a cross sectional view of a probe card used for the conventional high-speed wafer parallel test.

Referring to FIGS. 1 and 2, a performance board 20 is mounted on a test head 10 installed at one end of a tester. Also, a probe card 30 is connected to the performance board 20 using a ZIF connector 12 which, for example, tightens connected portions by means of a locking lever. An exemplary structure of the ZIF connector 12 is described in U.S. Pat. No. 7,077,675 B2, entitled "ZIF Connector In Which A Position Of A Contact Is Automatically Adjusted During A Connection Operation," issued Jul. 18, 2006.

The conventional probe card 30 used for the electrical wafer parallel test includes a printed circuit board (PCB) 34 for a basic frame, a ZIF connector 34 connected to the performance board 20, an interposer 36, a multi-layer ceramic (MLC) substrate 38, and a plurality of needles 42.

The needles 42 are installed under the probe card 30 and connected to pads of semiconductor chips of a wafer 40. In this structure, an electrical parallel test can be performed on the wafer 40.

In order to confirm the high-speed parallel test limitations of the probe card 30, a simulation was conducted on the probe card shown in FIG. 2 using a vector network analyzer (VNA), which is a device for analyzing a frequency attenuation characteristic. In this analysis, the attenuation of a signal in a single path was measured as the frequency attenuation characteristic. The simulation result is that only a test frequency of 500 MHz was assured on the basis of −1 dB.

Loss of signals was measured in each of first through third paths as shown in the following Table 1. A first path for analysis was from the tip of the needle 42 to the MLC substrate 38, a second path for analysis was from the MLC substrate 38 to the interposer 36, and a third path for analysis was from the interposer 36 to the ZIF connector 32.

TABLE 1

| Analysis Path | Loss at DC [dB] | Loss at 500 MHz [dB] | Loss at 1 GHz [dB] | Loss at 2 GHz [dB] |
|---|---|---|---|---|
| Needle to MLC Substrate | −0.19 | −0.46 | −0.70 | −1.23 |
| MLC Substrate to Interposer | −0.00 | −0.01 | −0.03 | −0.10 |
| Interposer to ZIF Connector | −0.15 | −1.14 | −1.75 | −2.85 |
| Sum | −0.34 | −1.61 | −2.48 | −4.18 |

As can be seen from Table 1, the greatest loss of signals occurred in the path from the interposer 36 to the ZIF connector 32 in the probe card 30.

SUMMARY OF THE INVENTION

According to an aspect of the present invention, an electrical test system is provided which includes a test head, a performance board, a probe card and coaxial cables. The performance board includes a first side and an opposite second side, where the first side of the performance board is electrically connected to the test head and the second side of the performance board includes first coaxial cable connection portions. The probe card includes a first side and an opposite second side, where the first side of the probe card includes second coaxial cable connection portions and the second side includes a wafer test probes. The coaxial cables respectively electrically connect the first coaxial cable connection portions of the performance board to the second coaxial cable connection portions of the probe card.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 3:
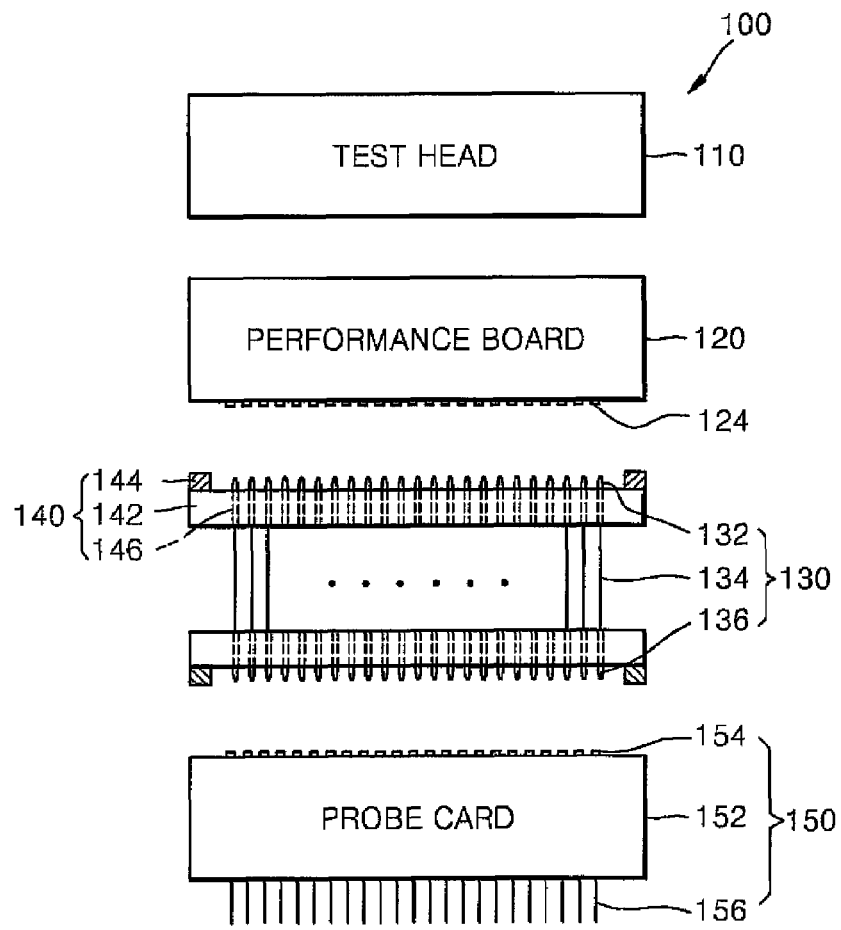
FIG. 3 is a block diagram of an electrical test system according to an embodiment of the present invention.

FIG. 3 is a block diagram of an electrical test system for a high-speed wafer parallel test according to an embodiment of the present invention.

Referring to FIG. 3, the electrical test system 100 of this embodiment includes a test head 110, a performance board 120, a coaxial cable bundle 130, and a probe card 150.

One side of the performance board is connectable to the test head 100, and an opposite side of the performance board 120 includes first coaxial cable connection portions 124. For example, the first coaxial cable connection portions 124 may be the lands of a printed-circuit-pattern.

The probe card 150 includes second coaxial cable connection portions 154 on one side thereof, and a plurality of wafer probes 156 on an opposite side thereof. The wafer probes 156 may, for example, be probe needles. During testing, the wafer probes 156 are brought into contact with a wafer (not shown) to be tested. Like the first coaxial cable connection portions 124, the second coaxial cable connection portions 154 may be the lands of a printed-circuit-pattern.

Also, as shown in FIG. 3, the coaxial cable bundle 130 is operatively interposed between the first coaxial cable connection portions 124 and the second coaxial cable connection portions 154. That is, the coaxial cable bundle 130 is utilized to connect the first coaxial cable connection portions 124 of the performance board 120 to the second coaxial cable connection portions 154 of the probe card 150.

The coaxial cable bundle 130 includes third coaxial cable connection portions 132 and fourth coaxial cable connection portions 136 connected at opposite ends of coaxial cables 134, respectively. The third coaxial cable connection portions 132 contact the respective first coaxial cable connection portions 124, and the fourth coaxial cable connection portions 136 contact with the respective second coaxial cable connection portions 154. For example, the third and fourth coaxial cable connection portions 132 and 136 may be pogo pins. The coaxial cables 134 and the third and fourth coaxial cable connection portions 132 and 136 are secured by coaxial cable fixing portions 140. An example of the coaxial cable fixing portion 140 will be described later with reference to FIG. 6.

Also, each of the coaxial cables 134 may include a signal line, which is located in the cable center to minimize loss of signals, and a ground line, which is located as an insulating structure outside the signal line. Thus, for example, when a signal is transmitted from the signal line of the coaxial cable 134 with a length of 1 mm or less, stable grounding is maintained, thus preventing or minimizing the occurrence of noise and minimizing the attenuation of the signal.

The above-described electrical test system 100 is suitable for parallel testing, i.e., simultaneous electrical testing of plural semiconductor chips. Examples of such chips are semiconductor memory chips forming wafer stack packages (WSPs).

A method of testing which utilizes the above-described electrical test system 100 includes using the coaxial cable bundle 130 to electrically connect the performance board 120 (attached to the test head 110) with the probe card 150. Thereafter, an electrical test with minimal noise and signal loss may be performed on a wafer (not shown) connected to the probe card 150.

By utilizing the coaxial cable bundle 130 to electrically connect the performance board 120 with the probe card 150, a signal loss of −1dB or less may be realized even in a high-speed (2 GHz) test. Thus, a high-speed parallel test of a wafer can be executed, for example, where semiconductor chips of the wafer are use to fabricate wafer stack packages (WSPs).

Figure 4:
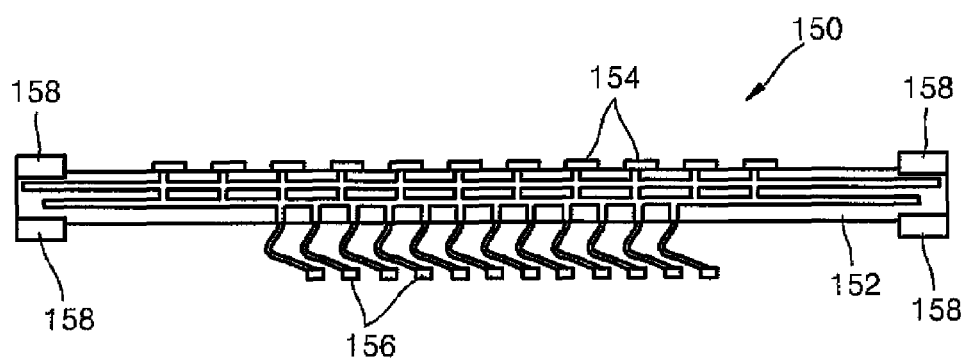
FIG. 4 is a cross sectional view of a probe card shown in FIG. 3 according to an embodiment of the present invention.

FIG. 4 is a cross sectional view of the probe card 150 shown in FIG. 3 according to an embodiment of the present invention.

Referring to FIG. 4, the probe card 150 of this embodiment includes a multi-layer ceramic (MLC) substrate 152 having a printed circuit pattern, land-type second coaxial cable connection portions 154 installed on a top surface of the MLC substrate 152, and probe needles 156. The probe needles 156 are electrically connected to the second coaxial cable connection portions 154 through the MLC substrate 152 and extend downward from a bottom surface of the MLC substrate 152. Reference numeral 158 generally denotes a protrusion used for aligning and combining the probe card 150 with the coaxial cable bundle 130 (see FIG. 3 ).

The substrate 152 may be formed of ceramic to minimize differences in coefficients of thermal expansion relative to silicon. Alternately, as examples, the substrate 152 may be formed of BT resin or FR4 resin typically used in the formation of a PCB.

Figure 1:
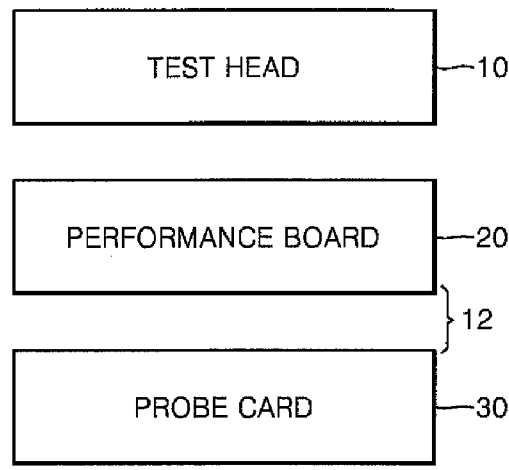
FIG. 1 is a block diagram of a conventional electrical test system.
Figure 1:
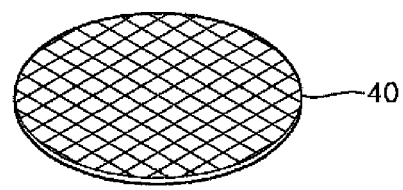
Figure 2:
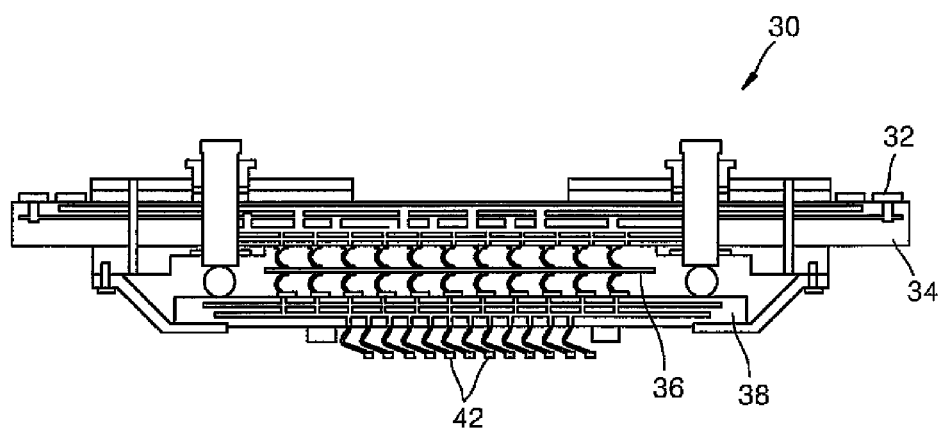
FIG. 2 is a cross sectional view of a conventional probe card.

In addition to reducing the attention of high frequency signals, the coaxial cable bundle 130 allows for a more simplified structure of the probe card 150 when compared to the conventional probe card 30 illustrated in FIG. 2. This simplified structure can further reduce attenuation of signals in a high-speed test.

In the embodiment of FIG. 4, the second coaxial cable connection portions 154 are less densely spaced then the probe needles 156 disposed under the substrate 152. Alternatively, the second coaxial cable connection portions 154 may be respectively aligned directly over the probe needles 156 so long as a sufficiently high spacing density of the fourth coaxial cable connection portions 136 of the coaxial cable bundle 130 can be achieved.

Figure 5:
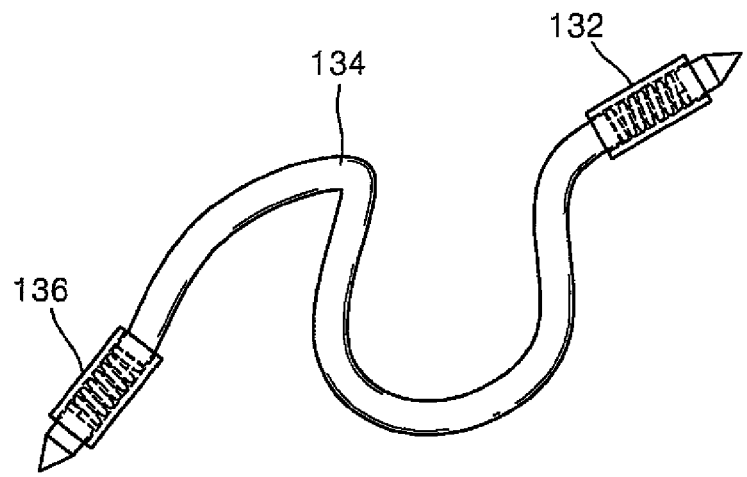
FIG. 5 is a perspective view of a coaxial cable shown in FIG. 3 according to an embodiment of the present invention.

FIG. 5 is a perspective view of one of the coaxial cable assemblies of the coaxial cable bundle 130 shown in FIG. 3 according to an embodiment of the present invention.

Referring to FIG. 5, the coaxial cable assembly includes a third coaxial cable connection portion 132 and a fourth coaxial connection portion 134 disposed at opposite ends of a coaxial cable 134. As described above, the third coaxial cable connection portion 132 contacts one of the first coaxial cable connection portions 124 (FIG. 3 ), and the fourth coaxial cable connection portion 136 contacts one of the second coaxial cable connection portions 154 (FIG. 3 ). A signal line contained in the coaxial cable 134 is shielded by a ground line as explained above, thus minimizing the attenuation of signals during a high-speed test. Also as described above, either or both of the third coaxial cable connection portion 132 and a fourth coaxial connection portion 134 may optionally be constituted of pogo pins.

Figure 6:
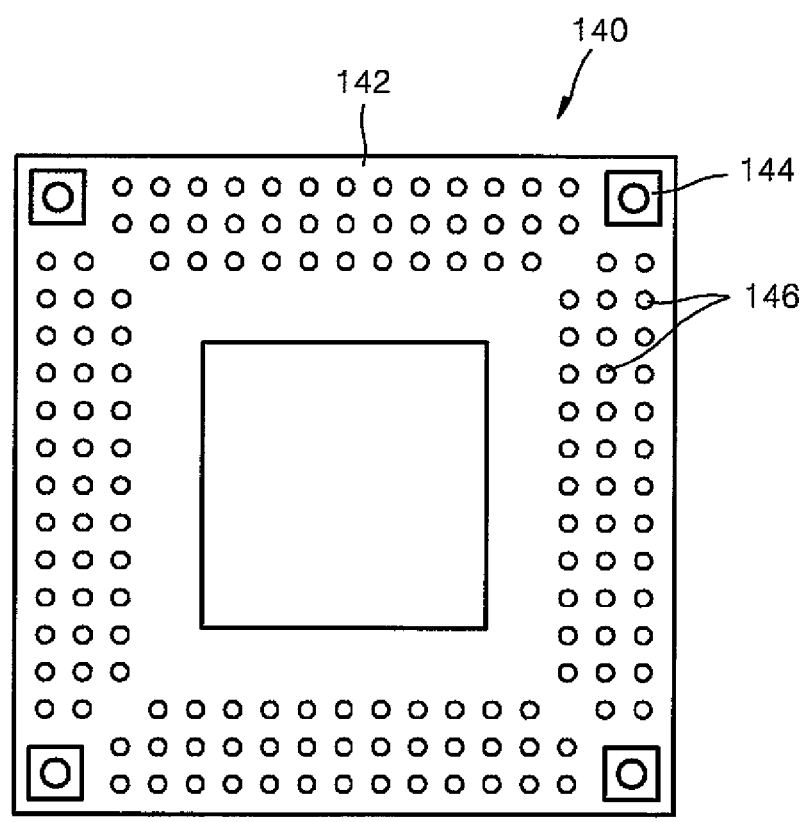
FIG. 6 is a plan view of a fixing portion of the coaxial cable assembly shown in FIG. 3 according to an embodiment of the present invention.

FIG. 6 is a plan view of a fixing portion 140 of the coaxial cable bundle 130 shown in FIG. 3.

Referring collectively to FIGS. 3 and 6, the third and fourth coaxial cable connection portions 132 and 136 of the bundle 130 of coaxial cables are secured by the coaxial cable fixing portion 140. The coaxial cable fixing portion 140 of this embodiment includes a main body 142 formed of an insulating material, fixing holes 146 formed through the main body 142, and alignment/combination portions 144 formed at the respective four corners of the main body 142. The alignment/combination portions 144 may be used for proper alignment with the performance board 120 or the probe card 150.

As described above, a probe card having a simplified structure is provided, and the connection of the performance board to the probe card is improved by use of coaxial cables, thus allowing super-GHz high speed electrical wafer parallel testing. Thus, testing of WSP semiconductor chips can be conducted in parallel on a wafer level.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An electrical test system comprising:
   a test head;
   a performance board including a first side and an opposite second side, wherein the first side of the performance board is electrically connected to the test head and the second side of the performance board includes first coaxial cable connection portions;
   a probe card including a first side and an opposite second side, wherein the first side of the probe card includes second coaxial cable connection portions and the second side includes wafer test probes;
   coaxial cables interposed electrically in series between the performance board and the probe card and respectively electrically connecting the first coaxial cable connection portions of the performance board to the second coaxial cable connection portions of the probe card; and
   a coaxial cable assembly which comprises:
      the coaxial cables;
      third coaxial cable connection portions located at a first end of the coaxial cables, respectively;
      fourth coaxial cable connection portions located at a second end of the coaxial cables, respectively, wherein the second end is opposite the first end;
      wherein the third coaxial cable connection portions are electrically connected to the first coaxial cable connection portions of the performance board, and the fourth coaxial cable connection portions are electrically connected to the second coaxial cable connection portions of the probe card.

2. The system of claim 1, wherein the probe card comprises a printed circuit pattern substrate including opposite first and second surfaces, wherein the second coaxial cable connection portions are located on the first surface of the substrate and the wafer test probes are located on the second surface of the substrate, and wherein the second coaxial cable connection portions and the wafer test probes are respectively electrically connected to each other through the substrate.

3. The system of claim 2, wherein a spacing density of the second coaxial cable connection portions is less than a spacing density of the wafer test probes.

4. The system of claim 2, wherein the second coaxial cable connection portions are respectively aligned directly over the wafer test probes.

5. The system of claim 2, wherein the substrate is a ceramic substrate.

6. The system of claim 2, wherein the printed circuit pattern substrate is a multi-layer ceramic (MLC) substrate.

7. The system of claim 1, wherein the first and second coaxial cable connection portions are lands of a printed circuit pattern.

8. The system of claim 1, wherein the third and fourth coaxial cable connection portions include pogo pins.

9. The system of claim 1, wherein each of the coaxial cables comprises a signal line and a ground line disposed as an insulating structure coaxially with the signal line, wherein the signal line is located within the ground line.

10. The system of claim 1, wherein the third and fourth coaxial cable connection portions are secured by a coaxial cable fixing portion.

11. The system of claim 10, wherein the coaxial cable fixing portion comprises a main body formed of an insulating material, and fixing holes formed through the main body.

12. The system of claim 11, wherein the coaxial cable fixing portion further comprises alignment/combination portions located at respective corners of the main body.

13. The system of claim 12, wherein the alignment/combination portions protrude from the main body of the coaxial cable fixing portion.

* * * * *